(12) United States Patent
Eldridge et al.

(10) Patent No.: US 7,952,375 B2
(45) Date of Patent: May 31, 2011

(54) AC COUPLED PARAMETERIC TEST PROBE

(75) Inventors: Benjamin N Eldridge, Danville, CA (US); A. Nicholas Sporck, Saratoga, CA (US); Charles A Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 803 days.

(21) Appl. No.: 11/447,371

(22) Filed: Jun. 6, 2006

(65) Prior Publication Data
US 2007/0296435 A1 Dec. 27, 2007

(51) Int. Cl.
*G01R 31/00* (2006.01)
*G01R 31/26* (2006.01)

(52) U.S. Cl. ......... 324/756.04; 324/754.03; 324/755.11; 324/762.01

(58) Field of Classification Search ........... 324/754–765
See application file for complete search history.

(56) References Cited

U.S. PATENT DOCUMENTS

| | | | | |
|---|---|---|---|---|
| 3,798,541 | A | * | 3/1974 | Campbell et al. ............. 324/72.5 |
| 3,840,802 | A | * | 10/1974 | Anthony ........................ 324/219 |
| 4,189,203 | A | * | 2/1980 | Miller ............................ 439/263 |
| 4,700,192 | A | | 10/1987 | Zezuto |
| 5,091,691 | A | * | 2/1992 | Kamieniecki et al. ........ 324/765 |
| 5,177,439 | A | * | 1/1993 | Liu et al. ....................... 324/754 |
| 5,270,664 | A | * | 12/1993 | McMurtry et al. ............. 324/690 |
| 5,476,211 | A | | 12/1995 | Khandros .................. 228/180.5 |
| 5,920,765 | A | | 7/1999 | Naum |
| 5,974,622 | A | | 11/1999 | Louis et al. ................... 15/340.2 |
| 5,982,187 | A | | 11/1999 | Tarzwell |
| 6,049,976 | A | | 4/2000 | Khandros ........................ 29/843 |
| 6,154,043 | A | * | 11/2000 | Conboy et al. ................ 324/764 |
| 6,184,053 | B1 | | 2/2001 | Eldridge et al. ................. 438/52 |
| 6,449,308 | B1 | | 9/2002 | Knight, Jr. et al. |
| 6,482,013 | B2 | | 11/2002 | Eldridge et al. ................ 439/66 |
| 6,509,751 | B1 | | 1/2003 | Mathieu et al. ............... 324/754 |
| 6,520,778 | B1 | | 2/2003 | Eldridge et al. ................ 439/66 |
| 6,600,325 | B2 | | 7/2003 | Coates et al. ................. 324/519 |
| 6,616,966 | B2 | | 9/2003 | Mathieu et al. ................. 427/96 |

(Continued)

FOREIGN PATENT DOCUMENTS
WO WO 2006/017249 2/2006

OTHER PUBLICATIONS

U.S. Appl. No. 11/165,833, filed Jun. 24, 2005.

(Continued)

*Primary Examiner* — Ha Tran T Nguyen
*Assistant Examiner* — Emily Y Chan
(74) *Attorney, Agent, or Firm* — Kirton & McConkie

(57) ABSTRACT

A probe for contacting and testing ICs on a semiconductor device includes a dielectric insulating material tip. The dielectric tip does not contaminate the surface being probed unlike metal probe tips. A contact scrub is further not required with signals being capacitively or inductively coupled from the probe tip to the IC. Testing can be performed during early fabrication steps of the wafer without the need for applying a metalization layer to the wafer to form bond pads. Testing can be performed by inductively coupling an AC signal to the probe tip, with coupling enhanced by including a magnetic material in the dielectric probe tip. Using an AC test signal enables testing of ICs without requiring separate power and ground connections.

20 Claims, 11 Drawing Sheets

U.S. PATENT DOCUMENTS

| | | | | |
|---|---|---|---|---|
| 6,791,176 B2 | 9/2004 | Mathieu et al. | | 257/690 |
| 6,815,971 B2 | 11/2004 | Wang | | |
| 6,836,962 B2 | 1/2005 | Khandros et al. | | 29/844 |
| 6,841,986 B1 * | 1/2005 | Tannehill | | 324/95 |
| 6,882,239 B2 | 4/2005 | Miller | | 333/24 |
| 6,937,009 B2 * | 8/2005 | Ishihara et al. | | 324/207.25 |
| 2005/0024764 A1 | 2/2005 | Hsiao | | |
| 2006/0125465 A1 * | 6/2006 | Xiang et al. | | 324/72.5 |

OTHER PUBLICATIONS

A. Chiu, et al., IBM Journal for Research and Development, "Thin-Film Inductive Heads," vol. 40, No. 3, 1996.

Search Report, PCT application No. PCT/US2007/069806 (Jan. 21, 2009) (3 pages).

Preliminary Report on Patentability, PCT application No. PCT/US2007/069806 (Feb. 26, 2009) (6 pages).

* cited by examiner

AC COUPLED PARAMETERIC TEST PROBE

BACKGROUND

1. Technical Field

Embodiments of the present invention relate to components used to test integrated circuit devices under test (DUTs), either on a wafer, or diced up into individual dies. More particularly, embodiments of the present invention relate to test probes used to electrically connect a test system to electrical contact pads of the DUTs.

2. Related Art

Test systems to test DUTs during fabrication of a wafer typically include a test system controller that applies signals through channels of a probe card supporting test probes. The test probes are typically resilient to reduce damage to the wafer and the probes themselves during testing. To perform testing, the probes are brought into contact with conductive bond pads of DUTs formed on the wafer. In some cases, similar testing can be performed with a test system and probe card to test dies after the dies have been cut out from the wafer, but before wires are bonded to bond pads of DUTs on the dies.

During testing, contact made between the bond pads and resilient probes of the test system can cause damage to the DUT being fabricated. Contact between the probes and bond pads cause a scrub, or mark to be created on the bond pads being fabricated. Further, with a scrub made on the bond pad, debris will be created that must be cleaned from both the wafer and the probe card after testing.

Test systems have been proposed that enable testing without contact with pads of a DUT by moving a probe card close to a DUT without the probes touching, leaving an air gap. One such system is described in U.S. Pat. No. 6,882,239 by Miller, entitled "Electromagnetically Coupled Interconnect System." Another such system is described in U.S. Pat. No. 6,600,325 by Coates, et al., entitled "Method And Apparatus For Probing An Integrated Circuit Through Capacitive Coupling." It is desirable to provide further test systems that offer has less potential for scrubbing or damaging DUTs on a wafer or die during testing, and to decrease the amount of debris created due to scrubs of bond pads by test probes during testing.

SUMMARY

According to some embodiments of the present invention, a system is provided to electromagnetically couple a test signal between a test probe and components of an integrated circuit (IC) on a semiconductor substrate. In at least some embodiments, the probe has a dielectric insulating material tip. Testing using the probe with a dielectric tip includes contacting the substrate with the dielectric insulating material tip of the probe when test signals are electromagnetically coupled by capacitive or inductive coupling between the probe and components of the IC. In some embodiments, however, the probe can be spaced with an air gap separating the probe from the IC when test signals are electromagnetically coupled, obviating the need for the dielectric material tip during such tests. In some embodiments, the test signal applied is an AC signal to provide for inductive coupling. With an AC signal, a magnetic material can be used in the dielectric probe tip to increase signal coupling. Further with the AC coupled test signal, filtering can be applied to remove undesired harmonics before test results are determined.

BRIEF DESCRIPTION OF THE DRAWINGS

Further details of the present invention are explained with the help of the attached drawings in which.

DETAILED DESCRIPTION

Figure 1:
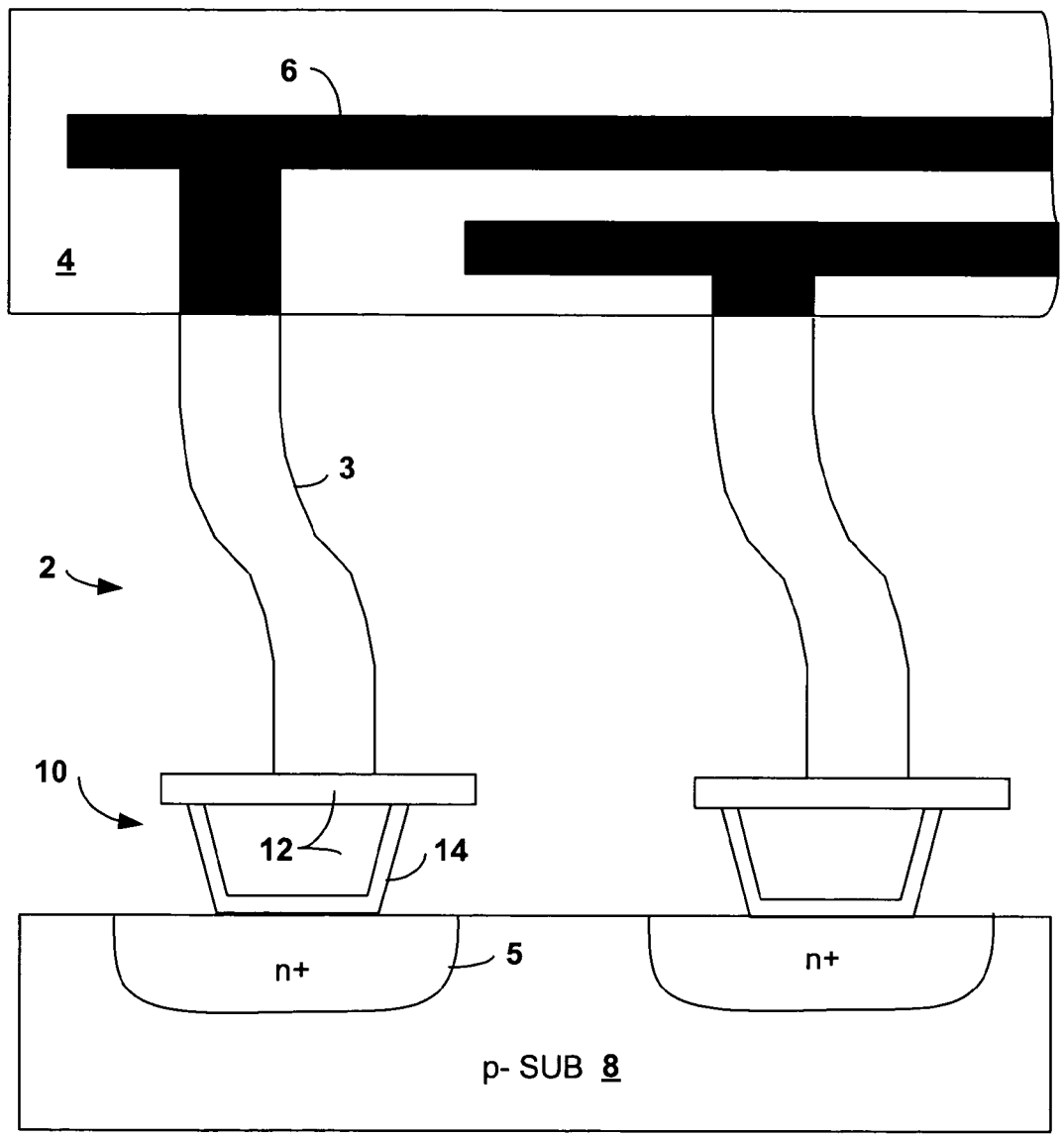
FIG. 1 shows probes attached to a probe card with the probes providing capacitive coupling according to some embodiments of the present invention.

FIG. 1 shows exemplary probes attached to a probe card with capacitive coupling according to some embodiments of the present invention. The probes 2 are shown in the embodiments of FIG. 1 as compliant spring wire probes. The probes 2 are connected to a substrate, such as space transformer 4. The space transformer 4 forms part of a probe card assembly that transfers test signals between a test system (not shown) and the probes 2. The space transformer 4 can include traces 6 that redistribute lines from a pitch where the probes 2 are connected to connectors provided at a different pitch.

The probes 2 can be compliant spring wire probes. Such compliant spring probes can include a wire member made from a flexible conductive material. Details of fabrication of the wire probes 2 is provided in U.S. Pat. No. 5,476,211, entitled "Method of Manufacturing Electrical Contacts, Using a Sacrificial Member," and U.S. Pat. No. 6,049,976 entitled "Method of Mounting Free-Standing Resilient Electrical Contact Structures to Electronic Components," all by Khandros. These patents describe wire probes manufactured by mounting an end of a flexible elongate core element (e.g., wire "stem" or "skeleton") to a terminal on an electronic component, coating the flexible core element and adjacent surface of the terminal with a "shell" of one or more conductive materials. The combination of thickness, yield strength, and elastic modulus of the core and shell materials provide satisfactory force-to-deflection characteristics of the resulting spring contact elements. Exemplary materials for the core element include gold and silver. Exemplary materials for the coating include nickel and its alloys. The resulting spring contact element is suitably used to effect pressure, or demountable, interconnections between two or more electronic components, including semiconductor devices.

Capacitive coupling between the probes 2 and substrate 8 in FIG. 1 is shown provided by a probe tip 10 attached to one end of a probe element 3. The probe tip 10 can be constructed from a conductive material 12 coated with a solid insulating material 14 that separates the conductive material 12 of the probe tip 10 from the substrate 8.

In one embodiment the insulating material 14 is silicon dioxide ($SiO_2$). In a non-limiting example, with the contact area of the probe tip 10 being 50×50 microns, the thickness of the dielectric insulation material coating 14 of $SiO_2$ is 50 Angstroms. This example probe tip can provide an impedance of 0.1 Ohm at 1 GHz and 1 Ohm and 100 MHz. An advantage of using a solid dielectric such as $SiO_2$ over a directly connected metal contact is that the dielectric will not contaminate the wafer.

The probe tip 10 can be attached to the probe element 3 by soldering, or other conductive attachment mechanisms such as a conductive adhesive. The probe tips 10 can be manufactured in an array before the probe elements are attached, with the array of tips 10 being precisely aligned relative to one another to match a separation pitch between pads on a DUT.

Figure 2A:
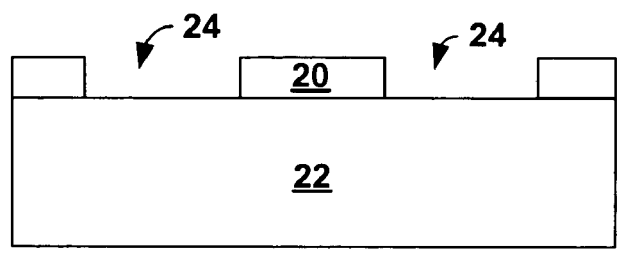
FIGS. 2A-2H illustrate a method of manufacturing probe tips and attaching the probe tips to wire probes to form the structure of FIG. 1.
Figure 2B:
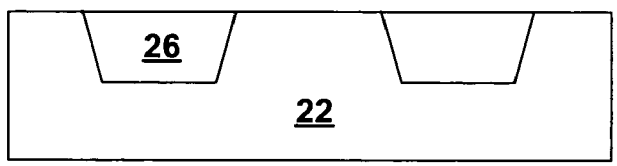

In one embodiment, the array of probe tips are manufactured using a photolithographic process as illustrated in FIGS. 2A-2H. Initially, as shown in FIG. 2A, a layer of photoresist 20 is applied to a substrate 22, such as silicon, and masked and etched to leave openings 24 in locations aligned where probe tips locations are desired. Subsequently, etching is performed to create indentations 26 in the substrate 22 where openings 24 are located. The photoresist 20 is then removed leaving the indentations 26 in substrate 22 as shown in FIG. 2B. The time of etching can be controlled the taper of the edge of the indentations 26. Components shown in FIG. 2A that are carried over to FIG. 2B are similarly labeled, as will be components carried over in subsequent drawings.

Figure 2C:
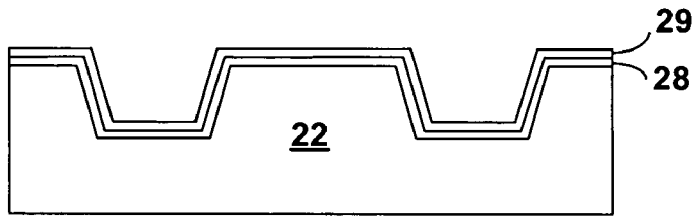
Figure 2D:
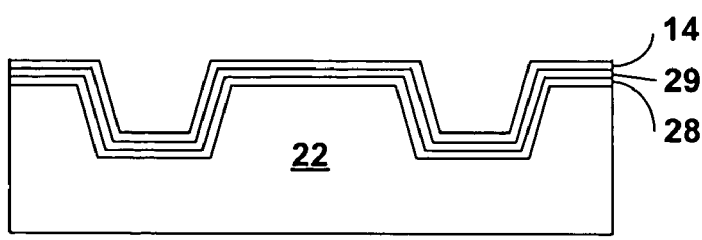
Figure 2E:
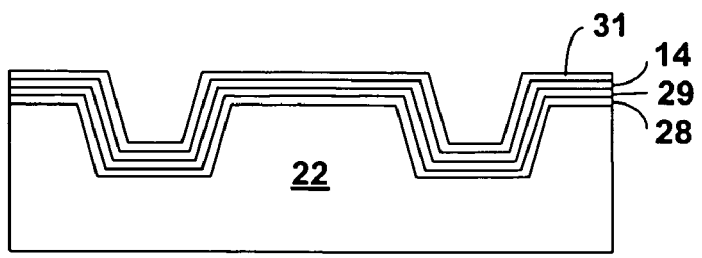

Further, as illustrated in FIG. 2C, one or more release layers 28 and 29 can be formed on substrate 22 and indentations 26. In one non-limiting example, the release layer can be a first layer of aluminum 28 applied to a silicon substrate 22, followed by a layer of copper 29. A layer of solid dielectric material 14 can then be applied then over the release layers 28 and 29 as shown in FIG. 2D. Non-limiting examples of dielectric material include silicon dioxide, diamond, diamond like carbon, organic, and other dielectric material that can be applied over a release layer as known by a person of ordinary skill in the art. A plating seed material 31 can then be applied over the dielectric 14 as shown in FIG. 2E to assure attachment of subsequent metal material to the dielectric. A non-limiting example of the plating seed material 31 is copper.

Figure 2F:
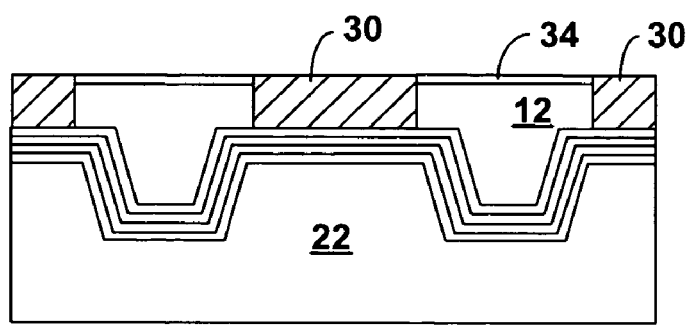

In further steps as illustrated in FIG. 2F, an additional layer of photoresist 30 can be applied and masked leaving openings over the indentations in the substrate 22. Metal plating 12 can then be applied in the openings in the photoresist 30 to form a bonding pad for subsequent attachment of probe contacts elements. Non-limiting examples of the plating material 12 includes nickel, nickel cobalt, copper, aluminum, etc. A thin layer of metal 34 can further be applied, such as gold, to better facilitate subsequent bonding of probe contacts elements to the tips.

Figure 2G:
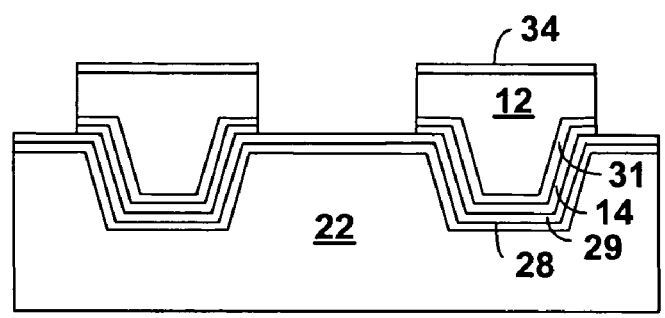

FIG. 2G next illustrates how etching can then be performed to remove the photoresist 30 as well as layers 31 and 14 underlying the photoresist 30, leaving only the release layers 28 and 29.

Figure 2H:
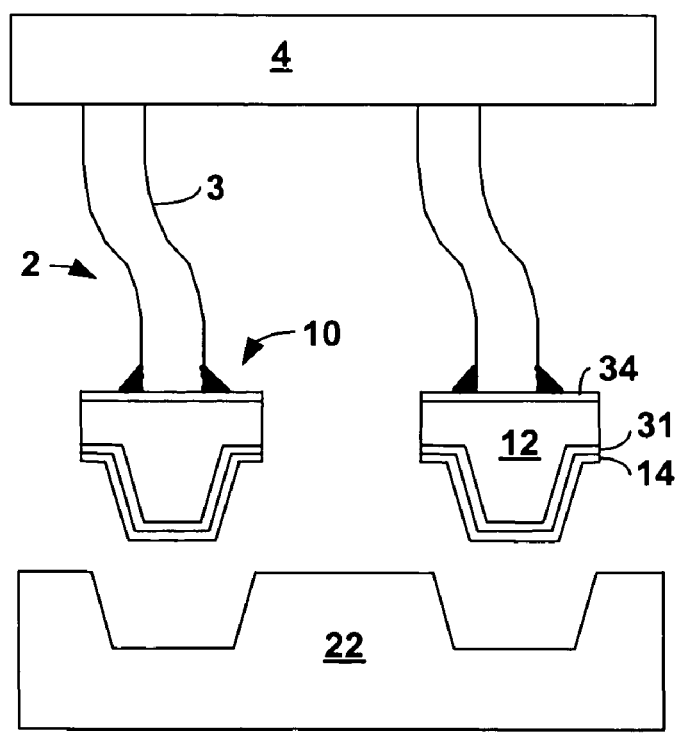

FIG. 2H illustrates how a space transformer 4 with probe elements 3 can then be brought into contact with the conductive material 12, or plating 31 if used, and attached using a bonding process. The probe elements 3 are attached using an attaching component 35, such as soldering, or an alternative attachment mechanism, such as conductive epoxy. Etching can then be performed to remove the excess release material plating 28 and 29, leaving the probe tips 10 formed from the substrate 22. Although shown with a dielectric tip formed separate from a probe element in FIGS. 2A-2H and later attached, the dielectric material can be applied by sputtering, chemical vapor deposition (CVD), laser photo chemistry or other technique directly to the probe element 3. A transfer is not required. Similarly, although the solid dielectric tip is shown formed using the steps 2A-2G, alternative fabrication methods can be used to form the head. For example, a thin film head like structure can be obtained and attached to spring probe elements. See IBM Journal of Research and Development "Thin-film inductive heads," by A. Chiu et al., Vol.40, 1996.

Figure 3:
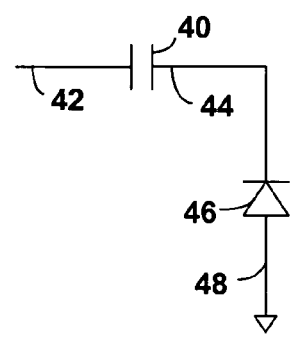
FIG. 3 shows an equivalent circuit for the attached probe tip with a coating of insulation material contacting an n+ region in a p− substrate connected to ground, as shown in FIG. 1.

FIG. 3 shows an equivalent circuit for the probe tip 10 as connected to the grounded substrate 8 shown in FIG. 1. The circuit includes a capacitor 40 between an input line 42 and line 44. The capacitance 40 is formed by the dielectric coating 14 on the probe tip 10. The input line 42 is equivalent to the conductive material of the probe tip 10, while the output line 44 is formed by the n+ region 5 of substrate 8. The junction of the n+ region 5 and p− substrate 8 material forms the diode 46. The substrate 8 can be attached to a conductive carrier (not shown in FIG. 1) forming a ground plane that is equivalent to the ground line 48.

Figure 4:
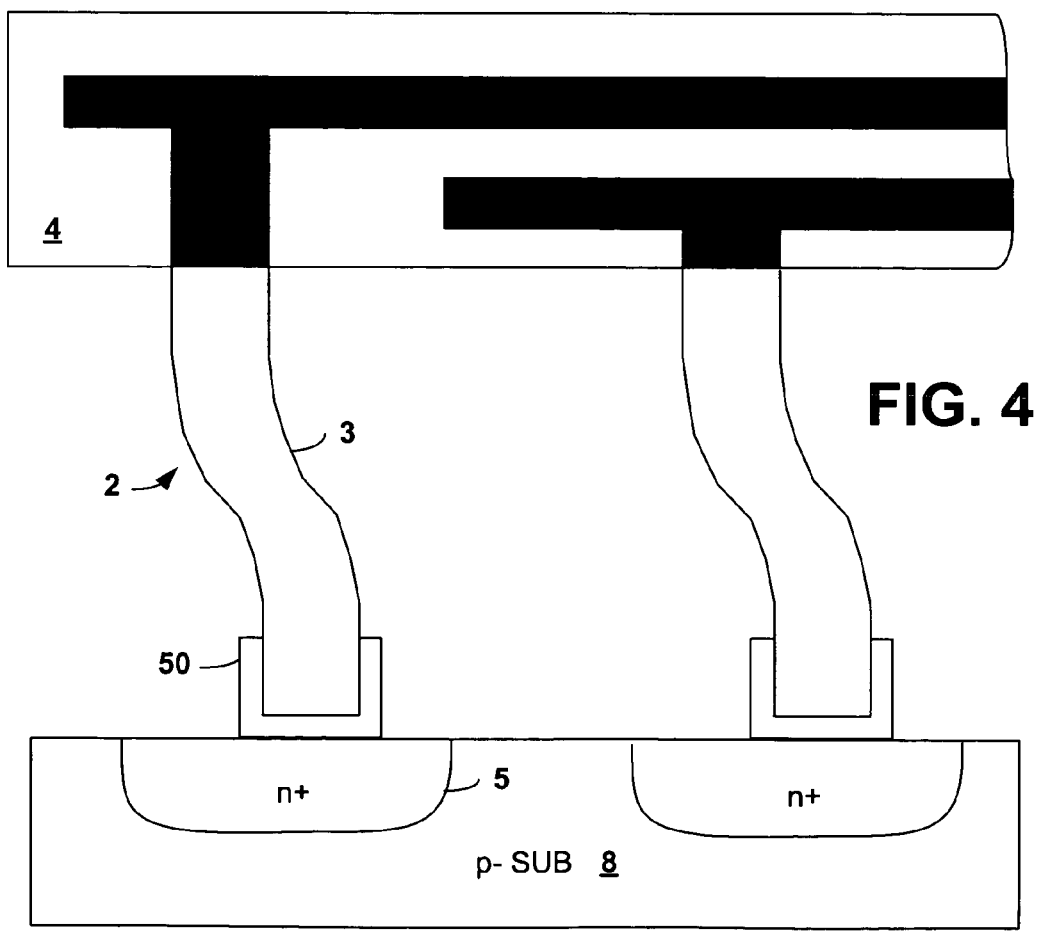
FIG. 4 shows alternative embodiments to FIG. 1 for constructing probes 2 to provide capacitive coupling by applying insulating material to a tip of a compliant probe wire according to some embodiments of the invention.

FIG. 4 shows an alternative embodiment to FIG. 1 for constructing probes 2 to provide capacitive coupling. In FIG. 4, the probe elements 3 having capacitive coupling provided by a dielectric insulating material layer 50 applied to an end of the probe element 3 opposite of its attachment point to the space transformer 4. The dielectric material 50 can be applied using one of a number of procedures. For example, a resilient spring probe element can be dipped in a dielectric material and removed to allow the dielectric material to cure on the element center conductor. As another example, the dielectric material can be sprayed or sputtered on. As another example, with the probe spring element having silicon on its tip, a dielectric material of silicon dioxide can be grown on the tip.

In operation, the probes 2 made up of compliant springs elements 3 coated with a dielectric material in one embodiment are contacted to n+ regions of the substrate 8. A capacitive region is formed by the dielectric material 50 between the compliant spring 3 of the probe and the n+ region to form an equivalent circuit as shown in FIG. 3.

Figure 5:
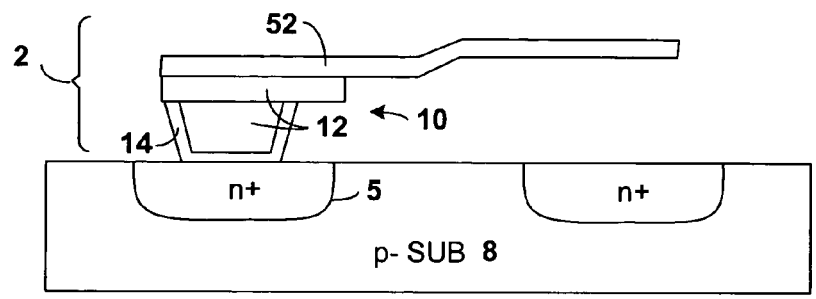
FIG. 5 shows a compliant probe structure with a capacitive tip, wherein a conductive member of the probe attaching to the tip is formed using a photolithographic process according to some embodiments of the invention.

FIG. 5 shows a compliant probe 2 with a capacitively coupled tip 10, wherein the conductive portion of the probe 2 is formed using a photolithographic process. As with the embodiment of FIG. 1, the probe 2 includes a capacitively coupled tip 10 made using a photolithographic process as described with respect to FIGS. 2A-2F. The tip 10 includes a conductive region 12 with a dielectric coating material 14, as in FIG. 1. In contrast with the probe spring element attached to the tip 10, the probe 2 of FIG. 5 further includes an elongate conductive member 52 that can be attached to the tip 10.

The elongate conductive member 52 can be formed using a photolithographic procedure as described in U.S. Pat. No. 6,482,013, titled "Microelectronic Contact Structure, and Method of Making Same," by Eldridge, et al. That patent discloses forming a spring contact element (including a spring contact element that is a cantilever beam) on a sacrificial substrate and then transferring and mounting the contact element to a terminal on an electronic component. The spring contact element is formed in the substrate itself using etching techniques. In a further patent, U.S. patent application, Ser. No. 6,184,053, titled "Microelectronic Spring Contact Elements," by Eldridge, et al, spring contact elements are described as formed on a substrate, including a substrate that is an electronic component, by depositing and patterning a plurality of masking layers to form an opening corresponding to a shape embodied for the spring contact element, depositing conductive material in the opening made by the patterned masking layers, and removing the masking layer to form the free-standing spring contact element. Additionally, U.S. Pat. No. 6,520,778, titled "Microelectronic Contact Structures and Methods of Making Same," by Eldridge et al., describes a contact element having a base end portion (post component), a middle portion (beam component) and a contact end portion (tip component) and methods for separately forming each portion and joining the post portion together as desired on an electronic component. Other patents describing lithographically formed contact elements include U.S. Pat. No. 6,791,176, entitled "Lithographic Contact Elements" and U.S. Pat. No. 6,616,966, entitled "Method of Making Contact Lithographic Springs."

The resilient conductive member 52 shown in FIG. 5 can be formed in the same manufacturing process as the tip 10 by simply adding and masking additional layers after the process steps to form tip 10 as described with respect to FIGS. 2A-2F. Alternatively, the resilient conductive member 52 can be formed in a separate process and later attached to the tip 10 by an attachment procedure, such as soldering, brazing by using conductive adhesive, or other means.

In operation with the embodiment of FIG. 5, the dielectric material 14 on the tip of probe 2 is brought into contact with the substrate 8 so that the conductive tip 12 of the probe is capacitively coupled to the n+ region 5 of the substrate 8. The equivalent circuit of FIG. 3 illustrates the capacitance formed between the probe 2 and the substrate 8 through the dielectric material 14 in FIG. 5 as series connected with a diode formed by the p-n junction between the n+ region 5 and p− substrate 8.

Figure 6:
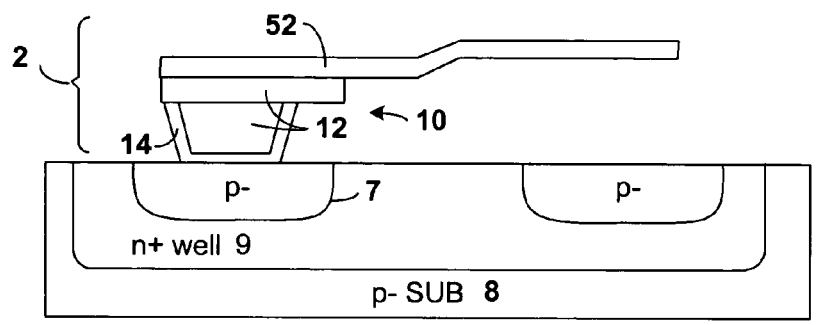
FIG. 6 shows a compliant probe structure for electromagnetically coupling signals to an alternative p− type implant region according to some embodiments of the present invention.

FIG. 6 illustrates some alternative embodiments of the present invention wherein the tip 10 is used to contact p− regions 7 in an n+ well 9 of the substrate 8. FIG. 6 shows that regions other than the n+ regions as shown in FIGS. 1, 4 and 5 can be contacted by a probe with a dielectric tip to make test measurements. Although p− regions 7 are shown in an n+ well 9, the p− regions 7 can possibly be formed in an n+ substrate. Other contact regions arrangements short of constructing a metalized pad region on the substrate 8 can likewise be tested using electromagnetic coupling through tip 10. Similarly, numerous substrate types, such as silicon or GaAs can be used to implant regions. Although particular regions, such as n+ regions, and particular substrates, such as silicon will be subsequently described, for convenience subsequent drawings and description will refer to n+ regions and silicon substrates to describe electromagnetic coupling of test signals using probe embodiments according to embodiments of the present invention.

By contacting the substrate 8 with a dielectric material, as illustrated in all of FIGS. 1, 4, and 6, the dielectric material 14 does not contaminate the surface being probed. The probe 2 can directly contact the implant regions on a substrate. Thus, testing can be performed during various stages of wafer processing, such as, prior to application of a metalization layer used to form contact pads. A further advantage of using the dielectric tip can be found when testing at elevated temperatures. With an air gap used instead of the dielectric material 14, the elevated temperatures can cause mechanical shifting of components, leading to a varying air gap and capacitance. By using a dielectric probe tip that is spring compressed against a substrate, the gap and signal coupling can be held constant despite movement between a mechanical device holding the probe tip with respect to the substrate.

Figure 7:
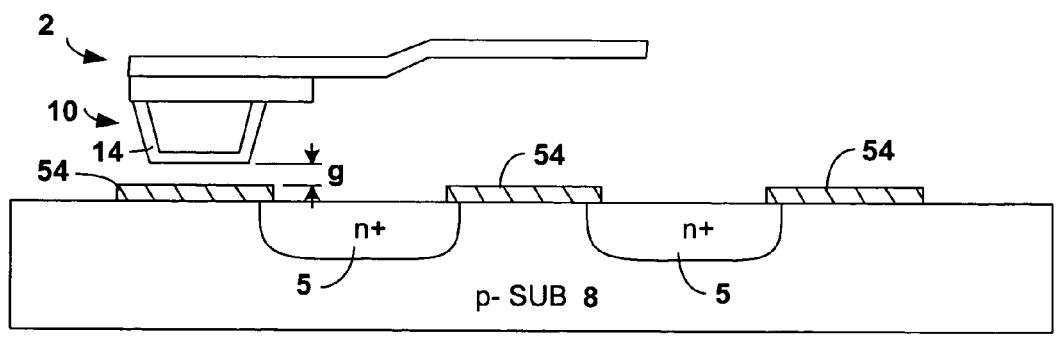
FIG. 7 illustrates testing using a probe structure according to some embodiments of the present invention with a gap provided between the probe tip and a substrate according to some embodiments of the invention.

Although FIGS. 1, 4, 5 and 6 show a direct contact between the substrate 8 and probe 2, FIG. 7 further illustrates that such contact is not required. In FIG. 7, the probe 2 is placed with a spacing "g" between the dielectric 14 of the probe tip 10 and the top of the contact region 54 on substrate 8. The spacing "g" simply adds to the total gap formed between conductive material 12 of the probe tip, and the n+ region on the substrate 8. The total capacitive gap is formed by the dielectric material 14 and air gap "g." In FIG. 7, conductive contact pads 54 and n+ regions 5 in the substrate 8 form a transistor. Although shown with a substrate 8 having conductive pads 54, it is contemplated that testing can be performed with a gap between probe 2 and an n+ region 5 of substrate 8 without such conductive pads. Further, since no scrub between the probe tip and wafer is required in FIG. 7 with the air gap "g" used, it is contemplated that the dielectric 14 can be eliminated.

Figure 9:
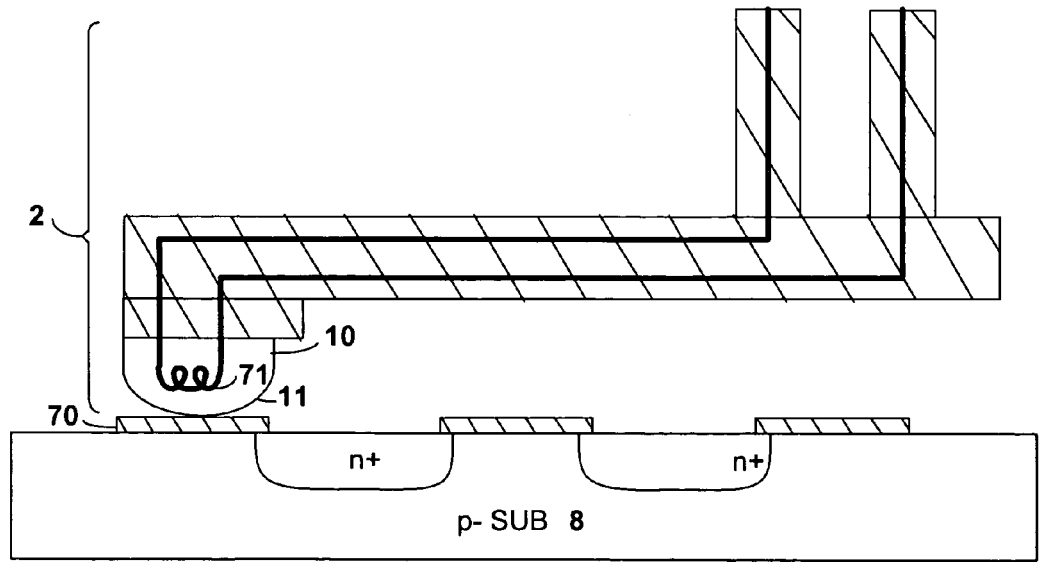
FIG. 9 shows an alternative to the probe structure embodiment of FIG. 7 wherein a rounded contact tip is provided according to some embodiments of the invention.

No contact scrub is required for testing to operate correctly, as illustrated by FIG. 7. Hence, no debris are generated. Without debris, steps are not required to clean the wafer after testing. Further, debris are not created in the probe card and around the probes 2 that require a probe card to be cleaned before further testing. Even with contact as shown in the configurations of FIGS. 1, 4, 5 and 6, materials of the tip 10 contacting a surface can be chosen, such as diamond, to minimize debris generation. Further, in some subsequently described embodiments, such as shown in FIG. 9, the geometry of the tip can be chosen to minimize debris generation. In particular, the rounded tip of FIG. 9 in combination with a hard material, such as diamond, leads to sliding or slipping so limited debris generation occurs on contact.

Figure 8:
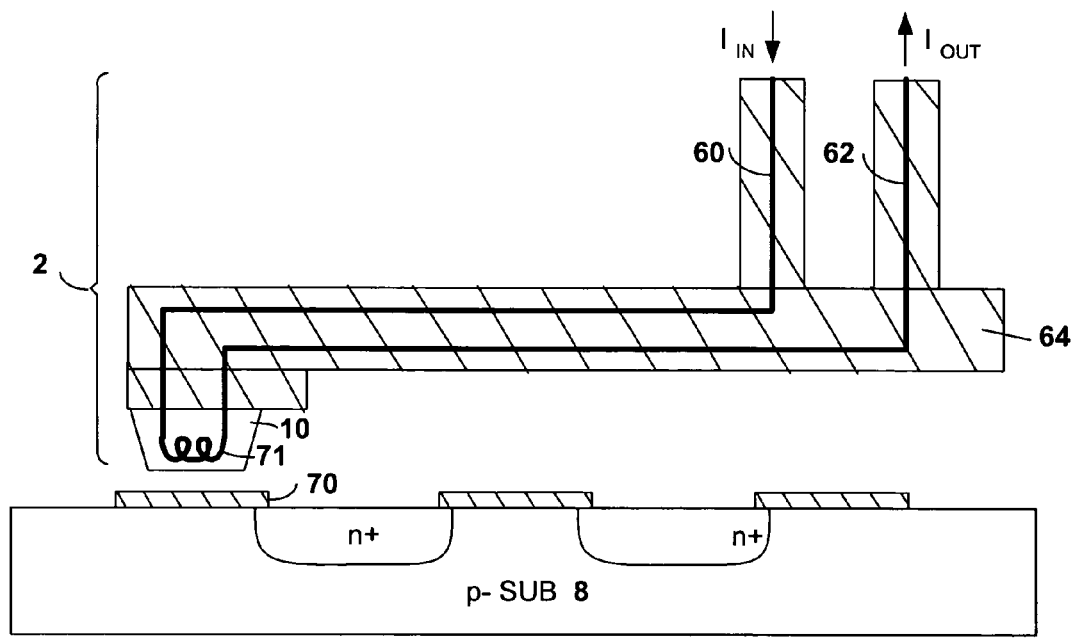
FIG. 8 shows a further alternative for a capacitively coupled probe tip according to some embodiments of the present invention that provides separate traces for coupling an AC signal to a substrate according to some embodiments of the invention.

FIG. 8 shows a compliant probe structure with a further alternative for an inductively coupled probe tip according to some embodiments of the present invention that can be used with AC signals. In FIG. 8, the probe 2 can contain two conductive traces 60 and 62, one for carrying current into the probe and another for carrying current out. The traces 60 and 62 can be separated by a dielectric insulating material in a probe arm member region 64, and a solid dielectric insulating material in the tip region 10. A loop structure 71 in the tip region 10 can allow inductive coupling of an AC signal from the probe tip 10 to a structure 70 formed on the substrate 8. The structures 70 and 71 can range from a spiral to a length of conductive line, depending on the amount of signal coupling desired. Although a structure 70 is shown as a metalization region on the substrate 8, in some embodiments the structure can be an implant region in the substrate.

The lines 60 and 62 of probes 2 of FIG. 8 can be formed using a number of procedures, including molding conductive lines 60 and 62 in dielectric material, or lithographically forming the conductive lines 60 and 62 and dielectric materials in layers. To form the probes 2 by molding, two resilient probe spring elements can be placed in a low dielectric material in a mold shaped to form the probe tip 10, and the dielectric material is allowed to cure. Additional dielectric material can then be poured around the remainder of the probe wires and allowed to cure to form the probe arm member 64. The dielectric constant of these two materials may be different. A method of shaping the resilient probe wires is described in U.S. Pat. No. 6,836,962, entitled "Method and Apparatus For Shaping Spring Elements," by Khandros, et al. A similar molding to place conductive members in a dielectric material can be performed using lithographically formed elongate conductive members 60 and 62 that are placed in the dielectric materials, with the dielectric material allowed to cure in the same manner as probe wires. In an alternative process, the entire probe structure with separate elongate conductive members 60 and 62 and dielectric material can be formed layer by layer in a photolithographic process similar to formation of the probe tip as described with respect to FIGS. 2A-2F.

FIG. 9 shows an alternative probe structure embodiment to FIG. 8, wherein the probe tip 10 has a rounded end 11. The rounded end 11 of the tip 10 provides a small contact surface area between the probe and a device to limit potential damage caused to the surface being probed relative to a non-rounded dielectric coated tip. The probe 2 of FIG. 9 is shown contacting the substrate 8, allowing a higher inductive coupling than the in FIG. 8, wherein a gap is provided between the probe 2 and structure 70 on the substrate 8. Although shown contacting the structure 70 on substrate 8 in FIG. 9, a probe 2 with a rounded tip 10, as in FIG. 9, can be used for testing without contacting the substrate 8 using a gap "g" according to some embodiments of the present invention.

Figure 10:
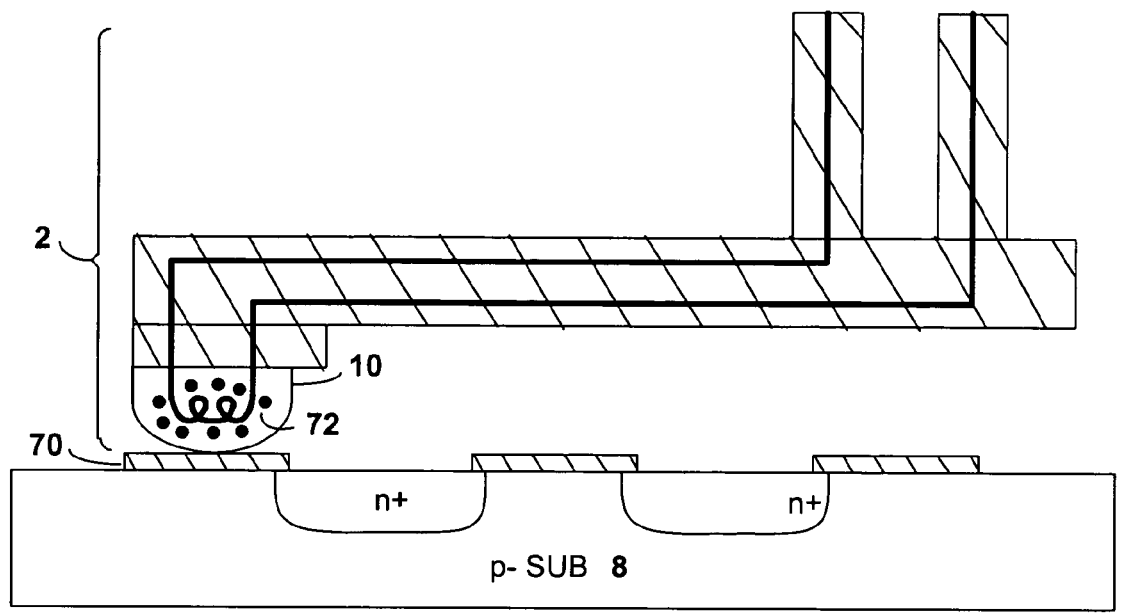
FIG. 10 shows a further embodiment of the present invention with the probe structure of FIG. 9 modified to provide magnetic material in the tip to improve coupling of the AC signal to the substrate according to some embodiments of the invention.

FIG. 10 shows an alternative embodiment to the probe structure of FIG. 9 wherein a ferro-magnetic material 72 is provided between lines 60 and 62 to enhance inductive signal coupling. The magnetic material can be iron powder or another magnetic powder material provided in the dielectric of the tip 10 prior to curing of the dielectric material. Ceramic ferrite is another common magnetic material that can be used to enhance magnetic coupling. Magnetic material enhances coupling directivity so that significantly more current will be generated by the probe 2 in the conductive structure 70 on the substrate 8.

Figure 11:
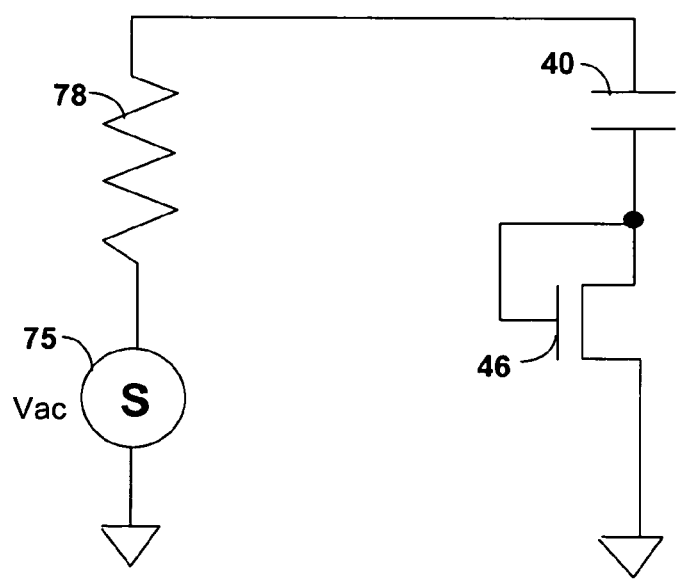
FIG. 11 shows an equivalent circuit for a test signal applied through a capacitive probe tip according to some embodiments of the invention.

FIG. 11 shows an equivalent circuit for applying a test signal to a capacitively or inductively coupled probe tip. The circuit includes a capacitance 40 created by a dielectric insulating material, and/or air gap between a conductive probe tip and substrate, similar to the equivalent circuit of FIG. 3. Also similar to FIG. 3, the circuit of FIG. 11 includes a diode 46 (shown in FIG. 11 as a diode connected transistor) connected between the capacitor 40 and ground. The diode connected transistor 46 is created by the n-p junction in the substrate. The circuit of FIG. 11 further includes a signal generator 75 of a test system for providing an AC test signal to the probe providing capacitance 40. The resistance 78 of the test system is further shown.

Figure 12:
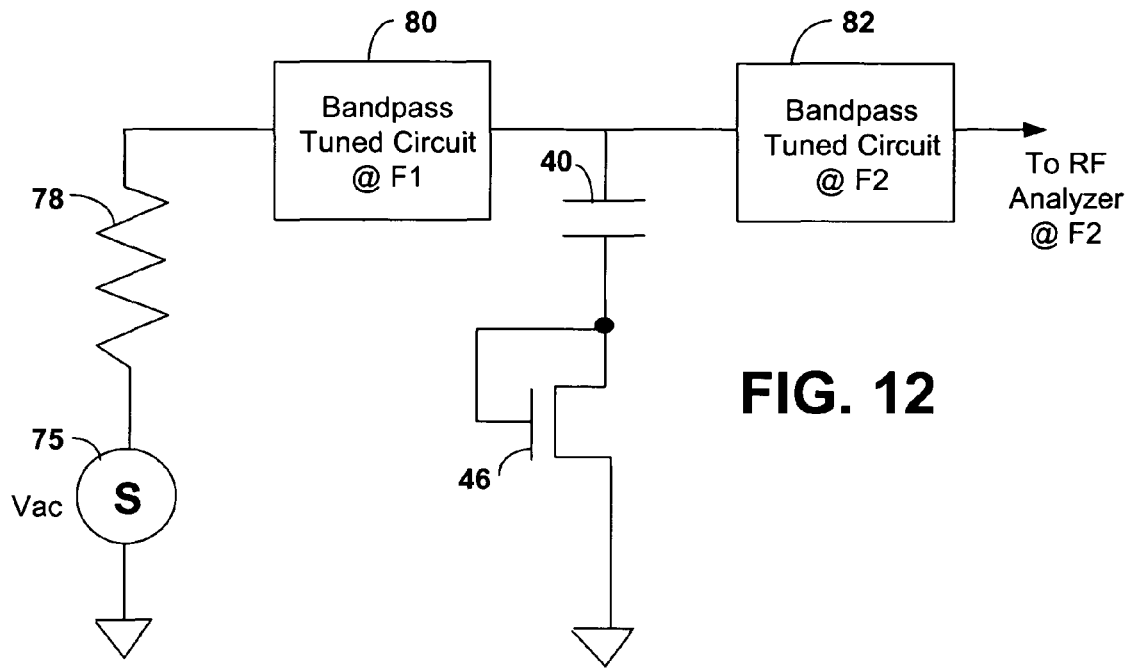
FIG. 12 shows the equivalent circuit of FIG. 11, as modified to include filters to enable AC testing by generating and comparing or measuring the harmonics.

FIG. 12 shows the equivalent circuit of FIG. 11, as modified to include filters to enhance AC testing by comparing harmonics. The diode's non-linear response distorts the applied AC test signal and thus generates harmonics of the applied test signal. This diode effect is sometimes referred to as the "square law" effect. The relative amplitude of an input AC test signal to an output AC test signal is a figure of merit of the diode's square law response. Generally, the lower the forward conductance and the less leakage, the larger the amplitude of a generated harmonic. The ratio of the input level to output level can also be used to determine a turn on threshold of a p-n junction being tested. By comparing input and output harmonic signals, a DUT can be tested without making separate power and ground connections normally needed to get test information. These techniques hence enable testing of PN junctions on the wafer prior to complete wafer fabrication and processing of all the metal and interconnects.

The circuit of FIG. 12 adds a bandpass filter 80 tuned to a test frequency F1 of the test input signal, as well as a bandpass filter 82 tuned to a test frequency F2 of a desired output harmonic. The bandpass filter 80 is shown provided after the test system resistance 78, indicating it can be provided as part of the probe card of the test system. In an alternative embodiment, however, the bandpass filter 80 can be provided in the test system separate from the probe card between resistance 78 and signal generator 75, or on the wafer or DUT. The bandpass filter 82 is shown as a separate output from the same channel as the probe creating capacitance 40. The bandpass filter 82 can be provided with a separate connection to the test system than bandpass circuit 80, and can be located in either the probe card, the wafer, the DUT, or elsewhere in the test system. The bandpass filter 82 suppresses the excitation signal from the test signal generator so that the desired harmonic signals created by the non-linear conductance of the DUT diode 46 can be more easily detected. FIG. 12 explicitly shows the filters for clarity of the intended application and measurements. Although FIG. 12 shows a specific embodiment for selecting the frequencies to be measured, stimulus and response equipment can be designed around the specific applications that would not require the use of such filter techniques.

Figure 13:
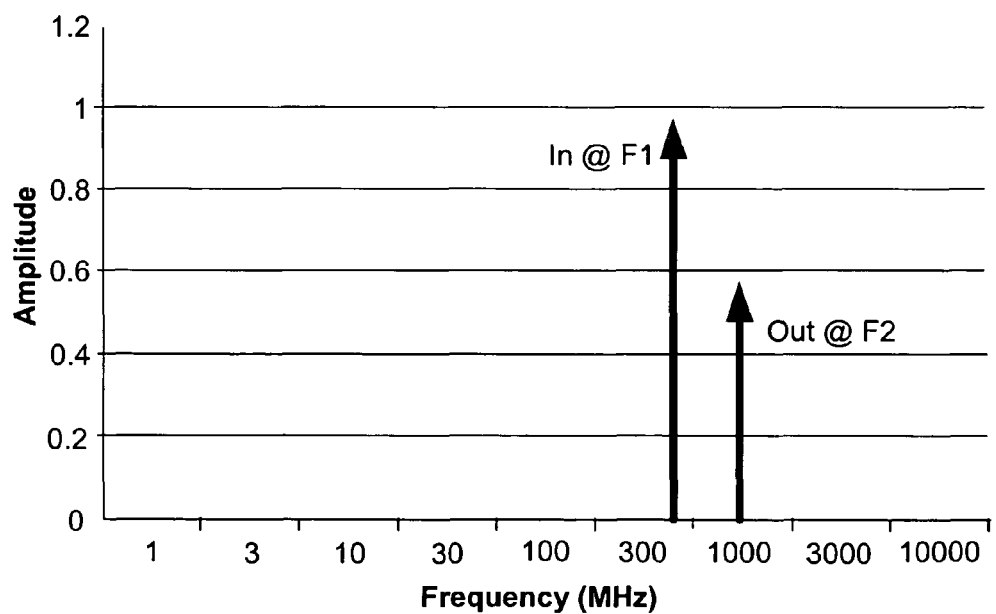
FIG. 13 provides a plot illustrating an example where an input signal is applied at a first frequency to create a harmonic output signal at frequency F2 in the system shown by FIG. 12.

FIG. 13 provides a plot illustrating an example where an input signal is applied at frequency F1 to create a harmonic output signal at frequency F2 using the system illustrated by FIG. 12. These signals can be obtained from bandpass filters 80 and 82 of FIG. 12. Comparison of the input and the output harmonic can be analyzed and compared to provide test results as discussed previously.

Figure 14:
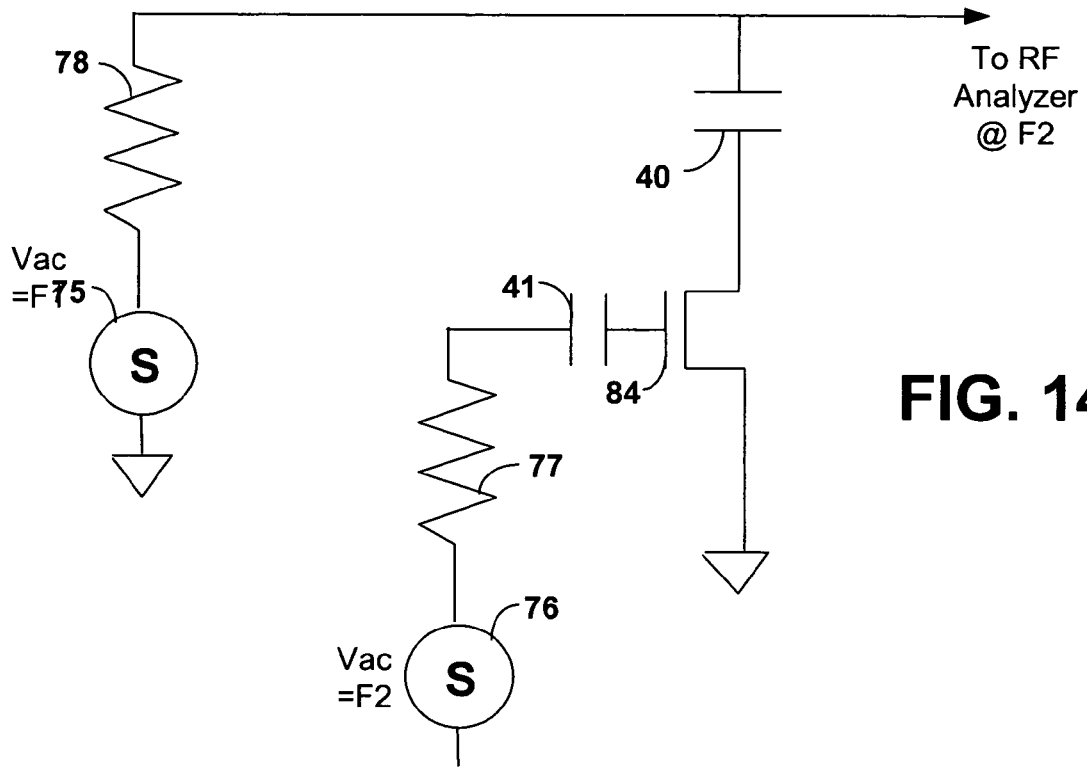
FIG. 14 shows the equivalent circuit for a test system that applies AC test signals to two different pads of a DUT for testing a transistor according to some embodiments of the invention.

FIG. 14 shows the equivalent circuit for a test system that applies AC test signals to two different pads of a DUT for testing a transistor. The test system includes a first channel connected through an electromagnetically coupled probe illustrated by capacitor 40, as well as a second channel with a electromagnetically coupled probe illustrated by capacitor 41. A first signal source 75 at frequency F1 from a test system is provided through a channel with resistance 78 to capacitor 40, while a second test signal source 76 at frequency F2 is applied through a separate channel to capacitor 41. Capacitor 40 couples a signal to a drain pad of the DUT, while the capacitor 41 couples a gate signal to transistor 84. An output from the drain of transistor 84 is provided through capacitor 40 for analysis. Thus, the transistor 84 is being configured to behave as a mixer or multiplier in this application. For the electromagnetically coupling, either inductive coupling or capacitive coupling can be used for all test approaches as described herein.

Figure 15:
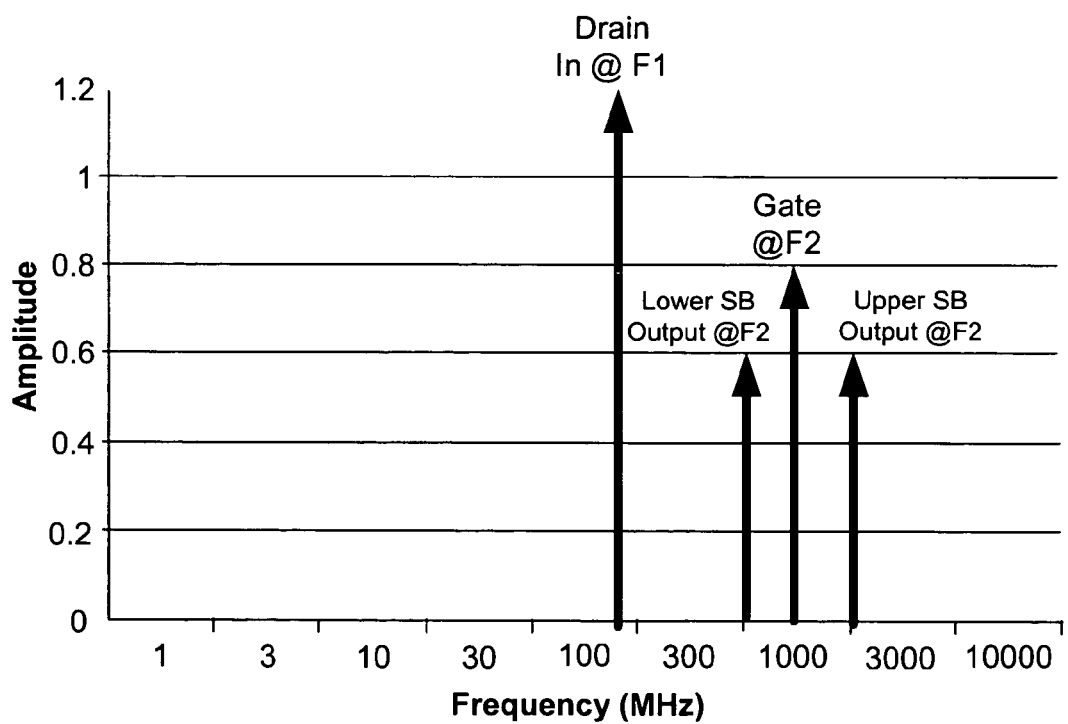
FIG. 15 provides a plot illustrating an example of signals applied to a gate and drain of a transistor, and resulting output harmonics from the test system shown in FIG. 14 according to some embodiments of the invention.

FIG. 15 provides a plot illustrating an example of signals applied to the gate and drain of transistor 84 in the test system of FIG. 14, and the resulting output of the mixer is the sum and difference of the two applied signal frequencies. As shown, the input signal at frequency F1 applied to the drain and a signal at frequency F2 applied to the gate of transistor 84 create upper and lower sideband (SB) signals centered around the gate frequency F2. To analyze test results, the amplitude of either the upper or lower sideband signals can be compared to the gate signal amplitude or to the drain signal amplitude. Although bandpass filters are not shown in FIG. 14, bandpass filters to eliminate the input signals or harmonics from desired output signals can be provided in signal paths similar to that shown in FIG. 12. As discussed with respect to FIG. 12, with AC coupling as described with respect to FIG. 14, testing of a DUT can be performed without connecting separate power supply and ground pins to obtain the test results.

Although two test configurations are illustrated in FIGS. 12 and 14, it is contemplated that other test configurations can be prepared depending on components of a DUT being tested within the scope of embodiments of the present invention. Components such as filters, rectifiers, capacitors, and other components needed to create and apply test signals as desired can be provided on a probe card, in the test system separate from the probe card, or in a device otherwise attached to the probe card, or resident on the wafer or DUT, also within the scope of the present invention.

Figure 16:
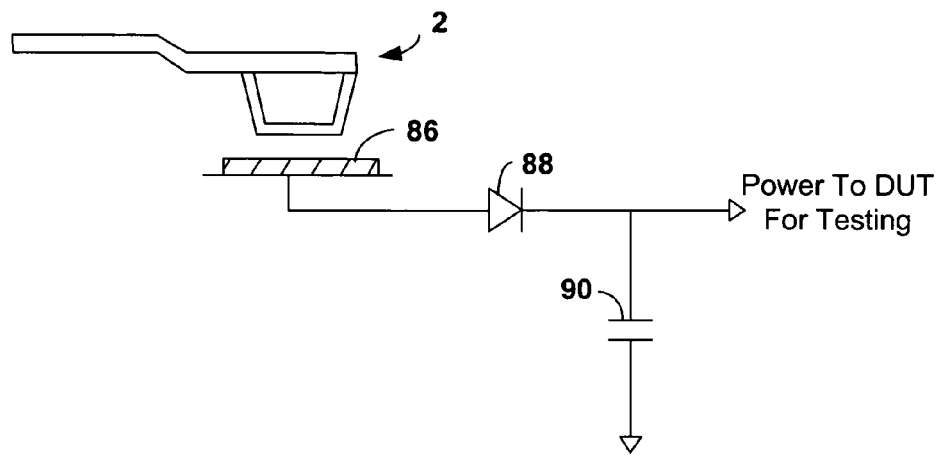
FIG. 16 illustrates how power can be coupled electromagnetically using a probe to make an AC connection according to some embodiments of the present invention.

FIG. 16 illustrates how power can be coupled electromagnetically using a probe to make an AC connection according to some embodiments of the present invention. As shown, the probe 2 electromagnetically couples a power supply signal to a pad 86. Although a pad 86 is illustrated, AC coupling can likewise be provided to an implant region of a substrate. The power supply signal from the pad 86 is provided through isolation diode 88 to power up a capacitor 90 on the test device. The diode isolates the power supply capacitor 90 to prevent reverse current from flowing back to the AC probe 2. The capacitor 90 then serves as a power supply to other components on the DUT during testing.

Figure 17:
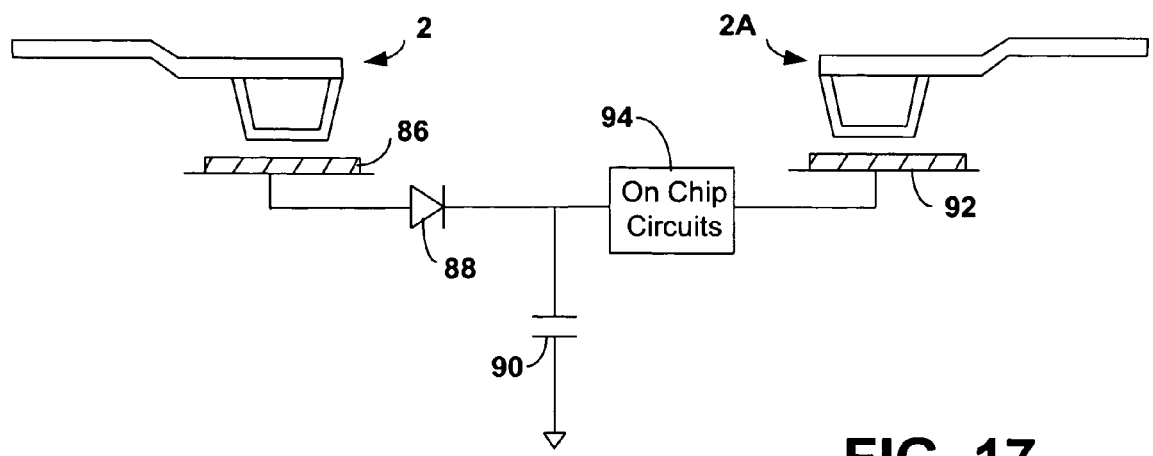
FIG. 17 illustrates electromagnetically coupling signals with a probe according to some embodiments of the present invention wherein circuitry on the DUT is included to process the AC coupled signals.

FIG. 17 illustrates electromagnetically coupling signals with a probe according to some embodiments of the present invention wherein circuitry on the DUT is included to process the AC coupled signals. As in FIG. 16, the probe 2 can electromagnetically couple a power supply signal to a pad 86 through an isolation diode 88 to a capacitor 90. A second probe 2A couples test signals between the DUT and a test system through a pad 94. On chip circuitry 94 can be included to provide the bandpass circuits of FIG. 12 to remove unwanted harmonics from the coupled signals. The on chip circuitry 94 can also include processing circuitry that generates test signals on the chip, with the test results monitored using the second probe 2A. The on chip circuitry 94 can similarly include other components that apply signals to circuit components, such as components of FIG. 14, or other components needed for testing depending on the circuitry of the DUT.

In some embodiments of the present invention signals provided using an electromagnetically coupled probe according to the present invention allow for parametric testing. Parametric testing is desirable during early stages of the wafer fabrication process, prior to formation of metal contact pads on a chip surface for bonding conductors. Parametric testing is performed to measure device characteristics, i.e. short, open and load testing of individual traces or circuits. Signals for parametric testing can be generated using an AC coupled probe, such as probe 2A of FIG. 17, or the parametric testing signals can be generated using circuitry on board a DUT, such as circuitry 94 of FIG. 17. An AC coupled probe can then be used to communicate the results of parametric testing from a DUT to a test system.

In some embodiments of the present invention, a first probe card can be used during earlier fabrication processes, and then swapped for a second probe card during later fabrication steps for efficient testing. The first probe card can be provided with inductively or capacitively coupled probes according to embodiments of the present invention to perform parametric testing during initial wafer fabrication processes when no metal pads are available. The second probe card is substituted or swapped with the first probe card to alternatively provide probes that directly contact pads on a wafer for subsequent testing.

Figure 18:
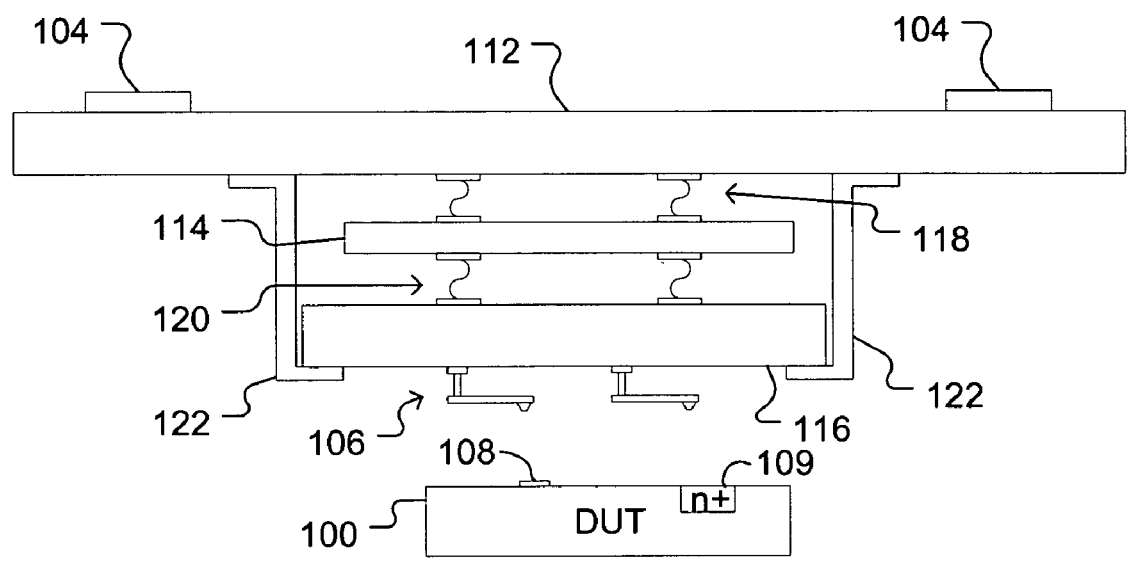
FIG. 18 shows an exemplary probe card assembly illustrating use of probes with dielectric coated tips according to some embodiments of the invention.

FIG. 18 shows an exemplary probe card assembly illustrating use of probes with dielectric coated tips according to some embodiments of the invention. The exemplary probe card assembly shown can be used to test one or more DUTs, such as DUT 100. The DUT 100 can be any electronic device or devices to be tested. Non-limiting examples of DUT 100 include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. Note that the term DUT, as used with respect to FIG. 18, refers to one or a plurality of such electronic devices.

The probe card assembly can act as an interface between a tester (not shown) and the DUT 100. The tester (not shown), which can be a computer or a computer system, can control testing of the DUT 100. For example, the tester (not shown) can generate test data to be input into the DUT 100, and the tester (not shown) can receive and evaluate response data generated by the DUT 100 in response to the test data. Probe card assembly can include electrical connectors 104, which can make electrical connections with a plurality of communications channels (not shown) from the tester (not shown). The probe card assembly can also include probes 106. The probes 106 can be configured to be pressed against electrical connection pad 108 and thus make electrical connections with input and/or output terminals of DUT. Similarly, the probes 108 can be pressed against an implant region 109, or held with a gap between the probe tip and pad 108 or implant region 109, as described herein previously according to some embodiments of the present invention.

Probe card assembly can also include one or more substrates configured to support connectors 104 and probes 106 and provide electrical connections between connectors 104 and probes 106. The exemplary probe card assembly shown in FIG. 18 has three such substrates, although in other implementations, probe card assembly can have more or fewer substrates. Shown in FIG. 18 are a wiring substrate 112, an interposer substrate 114, and a probe substrate 116. The wiring substrate 112, interposer substrate 114, and probe substrate 116 can be made of any type of substrate. Examples of suitable substrates include without limitation a printed circuit board, a ceramic substrate, an organic or inorganic substrate, etc. Combinations of the forgoing are also possible.

Electrically conductive paths (not shown) can be provided from connectors 104 through wiring substrate 112 to electrically conductive spring interconnect structures 118. Other electrically conductive paths (not shown) can be provided from spring interconnect structures 118 through interposer substrate 114 to electrically conductive spring interconnect structures 120, and still other electrically conductive paths (not shown) can be provided from spring interconnect structures 120 through probe substrate 116 to probes 106. The electrical paths (not shown) through the wiring substrate 112, interposer substrate 114, and probe substrate 116 can comprise electrically conductive vias, traces, etc. on, within, and/or through wiring substrate 112, interposer substrate 114, and probe substrate 116.

Wiring substrate 112, interposer substrate 116, and probe substrate 118 can be held together by brackets 122 and/or other suitable means. The configuration of probe card assembly shown in FIG. 18 is exemplary only and is simplified for ease of illustration and discussion. Many variations, modifications, and additions are possible. For example, a probe card assembly can have fewer or more substrates (e.g., 112,114, 116) than the probe card assembly shown in FIG. 18. As another example, the probe card assembly can have more than one probe substrate (e.g., 116), and each such probe substrate can be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. Nos. 5,974,622 and 6,509,751 and the aforementioned U.S patent application Ser. No. 11/165,833, filed Jun. 24, 2005, and various features of the probe card assemblies described in those patents and application can be implemented in the probe card assembly shown in FIG. 18. The probe card assembly can include integrated circuit components, or discrete components such as capacitors or inductors. There are many possible uses for one or more such electrical components that can be integrated into or formed with probes 106 of the probe card assembly.

Although the present invention has been described above with particularity, this was merely to teach one of ordinary skill in the art how to make and use the invention. Many additional modifications will fall within the scope of the invention, as that scope is defined by the following claims.

What is claimed is:

1. A test probe configured to physically contact and electrically couple with a substrate, the test probe comprising:
   an elongate electrically conductive member having an electrically conductive tip; and
   a solid dielectric insulating material coating on the tip,
   wherein the coating is positioned on the tip such that while the coating is in direct physical contact with a surface of the substrate:
      the coating covers entirely all of the tip that directly faces the surface, and the coating is between the tip and the surface and thereby prevents the tip from physically contacting the surface, and
      the tip electrically couples the elongate member through the coating with the surface.

2. The test probe of claim 1, wherein the conductive member is resilient.

3. The test probe of claim 1, wherein the dielectric insulating material comprises at least one of the following:
   silicon dioxide, diamond like carbon (DLC), tantalum oxide, barium-strontium-titanium dioxide (BST), diamond, an organic layer, and an inorganic layer.

4. The test probe of claim 1, wherein the tip is formed using a photolithographic process.

5. The test probe of claim 1, wherein the conductive member comprises a wire.

6. The test probe of claim 1, wherein the conductive member is formed using a photolithographic process.

7. The test probe of claim 1, wherein the coating has a rounded surface for contacting the substrate.

8. A probe card assembly comprising probes and support structures for the probes, wherein each of the probes comprises a test probe according to claim 1.

9. The test probe of claim 1, wherein only the coating physically contacts the substrate while the tip couples electrically the conductive member with the substrate.

10. The test probe of claim 1, wherein:
    the coating comprises a surface that contacts the surface of the substrate, and
    at least a portion of the surface of the coating is disposed directly between the tip and the surface of the substrate while the surface of the coating is in physical contact with the surface of the substrate.

11. The test probe of claim 10, wherein the portion of the coating comprises a solid, uninterrupted covering directly between the tip and the surface of the substrate.

12. The test probe of claim 1, wherein the tip capacitively couples the elongate member through the coating with the surface of the substrate.

13. The test probe of claim 1, wherein the tip is disposed at an end of the elongate member.

14. A test probe comprising:
    an elongate probe arm comprising a first dielectric material;
    a tip comprising a second dielectric material, the tip coupled to and extending from a surface of the probe arm;
    a first electrically conductive line disposed in the probe arm;
    a second electrically conductive line disposed in the probe arm, the first dielectric material electrically insulating the second conductive line from the first conductive line in the probe arm;
    and
    an inductive coupling element disposed in the tip, the first conductive line and the second conductive line extending into the tip and connecting to the inductive coupling element.

15. The test probe of claim 14, wherein the second dielectric material includes a magnetic material.

16. A probe card assembly comprising probes and support structures for the probes, wherein each of the probes comprises a test probe according to claim 14.

17. The test probe of claim 14, wherein the tip comprises a rounded surface for contacting a substrate.

18. The test probe of claim 14, wherein the inductive coupling element comprises a spiral.

19. The test probe of claim 14, wherein the inductive coupling element couples inductively the inductive coupling element through the second dielectric material to a substrate while the tip is in contact with the substrate.

20. The test probe of claim 14, wherein:
    the probe arm comprises a beam that is elongate in a first direction, and
    the tip extends from the surface of the probe arm in a second direction that is substantially perpendicular to the first direction.

* * * * *